United States Patent [19]

Yamamoto et al.

[11] Patent Number: 5,060,011
[45] Date of Patent: Oct. 22, 1991

[54] IMAGE RECORDING APPARATUS

[75] Inventors: Takemi Yamamoto; Jun Sakai; Mitsuru Ohta, all of Nagoya, Japan

[73] Assignee: Brother Kogyo Kabushiki Kaisha, Aichi, Japan

[21] Appl. No.: 335,492

[22] Filed: Apr. 10, 1989

[30] Foreign Application Priority Data

Apr. 28, 1988 [JP] Japan .................. 63-105691
Jul. 2, 1988 [JP] Japan .................. 63-165235

[51] Int. Cl.⁵ .............................. G03B 27/32
[52] U.S. Cl. .................. 355/27; 355/202
[58] Field of Search ........... 355/27, 28, 32, 77, 355/100, 326, 202; 420/138

[56] References Cited

U.S. PATENT DOCUMENTS

| | | | |
|---|---|---|---|
| 3,667,742 | 6/1972 | Kamola | 118/60 |
| 4,369,729 | 1/1983 | Shigenobu et al. | 355/285 X |
| 4,541,705 | 9/1985 | Knechtel | 355/285 |
| 4,563,086 | 1/1986 | Knapp et al. | 355/285 X |
| 4,647,182 | 3/1987 | Pierce | 355/32 X |
| 4,801,949 | 1/1989 | Misono et al. | 355/100 |
| 4,841,338 | 6/1989 | Suzuki | 355/27 |

FOREIGN PATENT DOCUMENTS

| | | |
|---|---|---|
| 2577472 | 8/1986 | France . |
| 1169410 | 11/1969 | United Kingdom . |
| 1350946 | 4/1974 | United Kingdom . |
| 1378798 | 12/1974 | United Kingdom . |
| 1527168 | 10/1978 | United Kingdom . |
| 2055619 | 3/1981 | United Kingdom . |
| 2172123 | 9/1986 | United Kingdom . |
| 2172711 | 9/1986 | United Kingdom . |
| 2201803 | 9/1988 | United Kingdom . |

OTHER PUBLICATIONS

"Electrophotographic Processes and Systems", published 1977 by Van Nostrand, p. 369.

Primary Examiner—L. T. Hix
Assistant Examiner—Khanh Dang
Attorney, Agent, or Firm—Oliff & Berridge

[57] ABSTRACT

An image recording apparatus which can provide an output visible image on an ordinary sheet. The apparatus uses a photosensitive recording medium whose surface is provided with microcapsules encapsulating therein a chromogenic material or dye precursor. Developer material particles are supplied over one of the photosensitive recording medium and the ordinary sheet for generating a chromogenic reaction with the dye precursor.

4 Claims, 2 Drawing Sheets

IMAGE RECORDING APPARATUS

BACKGROUND OF THE INVENTION

The present invention relates to an image recording apparatus which forms an image on a copying medium such as ordinary paper with using a photosensitive recording medium.

An image recording medium is generally classified into a self-contained type recording medium and a transfer type recording medium. In the self-contained type recording medium, an encapsulated chromogenic material or dye precursor and a developer material are co-deposited on one surface of a single substrate as one layer or as two contiguous layers. The self-contained type is disclosed in U.S. Pat. No. 4,440,846.

In the transfer type recording medium, the developer material is coated on a separate substrate as a separate developer or copy sheet. The transfer type is disclosed in U.S. Pat. No. 4,399,209. More specifically, the transfer type image recording medium comprises a microcapsule sheet (first image recording medium) and a developer sheet (second image recording medium . The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. Further, image recording method employing photosensitive recording medium is also disclosed in Japanese Patent Application Kokai Nos. 61-137749, 61-143738 and 61-173981.

The photosensitive recording medium which is used for such image recording methods has a surface carrying thereon the photosensitive microcapsules which encapsulate therein the chromogenic material (the first material. When the photosensitive recording medium is exposed to light in accordance with an image information, the microcapsules exposed to light are hardened for increasing their mechanical strength, whereas non-exposed microcapsules remain intact for maintaining their low mechanical strength. After the light exposure, a developing medium carrying the developer material (the second material) which can cause a chromogenic reaction with the dye precursor is laid over the microcapsule surface of the photosensitive recording medium and these are pressed together. By this pressure, the microcapsules having the lower mechanical strength on the microcapsule sheet are ruptured for allowing the chromogenic material to flow out of the microcapsules. Therefore, the chromogenic reaction takes place between the outflowing dye precursor and the developer material, &o thereby form a visible image on the developing medium.

However, conventionally, it has been necessary to use the developing medium which is produced by a paper making company and it has been impossible for the user to freely use various kinds of papers for forming the visible output image thereon. In other words, in case of the transfer type image recording method, always required are the specific developer sheet mediums which are provided with the developer material on their surfaces.

Further, there has been another image recording apparatus which uses a photosensitive pressure sensitive image recording medium and a mask member. More specifically, when a combined image consisting of a picture image and character image is to be formed on an identical copying sheet, dual exposures have been made by a photosensitive pressure sensitive recording process. That is, two types of mask members are prepared for independently masking the picture image region and character image region. When the exposure with respect to the picture image region is carried out, a first mask member is placed over the character image region, and when the exposure with respect to the character image region is carried out, a second mask member is placed over the picture image region. Therefore, dual exposures must be required while one of the mask members is precisely placed on the intended position for masking.

According to this method, the positional alignment of the mask member requires much skill. Further, since the mask members are placed over the picture image region and character image region of an original, it has been impossible to obtain a combined image in which a black or colored output character image is superposed on the output picture image region, though it may be possible to form a white-out zone (non-exposed zone with respect to the character image on the picture image region. Moreover, in the final output image, the character image is likely to lack clarity particularly in its edge portion, since a light reflected on or transmitted through the original is used.

SUMMARY OF THE INVENTION

It is therefore an object of this invention to provide an image recording apparatus which can easily form an image on any kind of copying sheet with employing a photosensitive recording medium.

Another object of this invention is to provide an image recording apparatus which can form composite picture and character images without requiring any such positional alignment and can, moreover, form an image containing colored characters each having a clear contour.

These and other objects of this invention will be attained by providing an image recording apparatus for recording an output image on a sheet medium, the output image corresponding to an image of an original, the apparatus using a photosensitive recording medium having a surface which carries microcapsules encapsulating therein a chromogenic material, the apparatus comprising; exposure unit for exposing to light said photosensitive recording medium for forming a latent image corresponding to the original image on the photosensitive recording medium; means for supplying a developer material particles which undergo a chromogenic reaction with the chromogenic material, the supplying means supplying the developer material particles onto one of the photosensitive recording medium and the sheet medium; and, pressure developing unit disposed downstream of the exposure unit for generating the chromogenic reaction between the chromogenic material and the developer material particles to provide the output image on the sheet medium, the sheet medium being an ordinary copying sheet.

DETAILED DESCRIPTION OF THE PREFERRED EMBODIMENTS

A first embodiment according to this invention will now be described with reference to FIG. 1.

Figure 1:
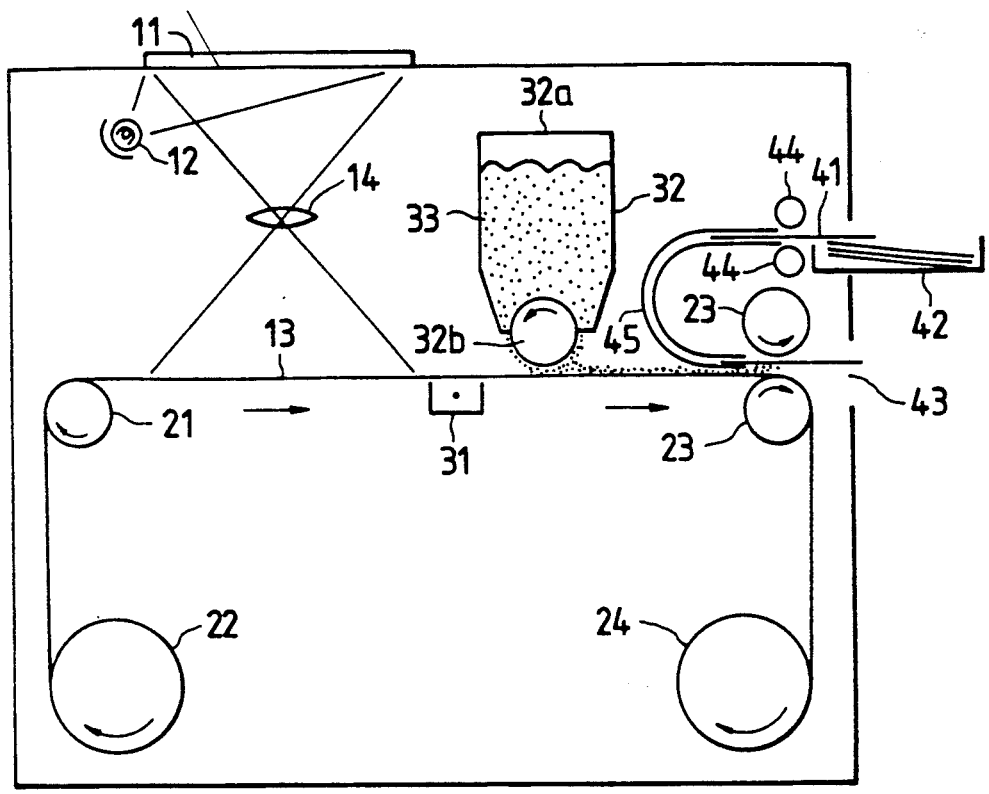
FIG. 1 is a schematic view showing an image recording apparatus according to a first embodiment of the present invention.

In FIG. 1, an exposure system includes a light source 12 and a lens 14. The light source 12 applies light to an original 11, and a lens 14 allows light reflected from the original 11 to pass therethrough 11 in order to form a latent image on a photosensitive recording medium 13. The photosensitive recording medium 13 has a surface carrying thereon photosensitive microcapsules which encapsulates therein a dye presursor or chromogenic material as already stated.

The photosensitive recording medium 13 is initially wound over a supply drum 22. The medium 13 unwound from the supply drum 22 is conveyed about a conveyor roller 21 and is delivered to the exposure system and a pressure developing unit 23. The medium 13 is wound on a takeup drum 24.

A charger 31 for charging the photosensitive recording medium 13 with electricity is provided at a path of the photosensitive recording medium 13. Further, a developer supplying unit 32 are also provided at the downstream side of the charger 31 with respect to the path. The developer supplying unit 32 includes a developer particle container 32a which accumulates &herein particles of a developer material particles 33. The particles 33 are capable of undergoing a chromogenic reaction with the dye precursor. The developer supplying unit 32 also includes a particle supplying sleeve 32b located in close proximity to the photosensitive recording medium 13.

A copying medium 41 of any kind, such as ordinary paper, is delivered from a cassette 42 and is conveyed by a sheet transfer system which includes conveyor rollers 44 and a sheet guide 45 to a discharge port 43 through the pressure developing unit 23.

Description will now be given with respect to operation of the apparatus which has been described.

Light is irradiated from the light source 12 to the original 11. A part of the light which is reflected by the original 11 is collected by the lens 14 and forms the latent image on the photosensitive recording medium 13. Then, the photosensitive recording medium 13 is uniformly charged with electricity by the charger 31. The developer particles 33 accumulated in the container 32a have a polarity opposite to that of the electricity with which the photosensitive recording medium 13 has been charged. The particle supplying sleeve 32b disperses the developer particles 33 to adhere uniformly to the latent imaging portion of the photosensitive recording medium 13.

On the other hand, the copying medium 41 which has been delivered from the cassette 42 is conveyed to the pressure developing unit 23 by the conveyor rollers 44 and the guide 45, so that the medium 41 can enter the pressure unit 23 synchronously with the travel of the photosensitive recording medium 13 on which the latent image has been formed. The latent imaging portion of the photosensitive recording medium 13 and the copying sheet medium 41 are superimposed with each other and subjected together to pressure by the pressure developing unit 23. The latent image on the photosensitive recording medium 13 which has been placed under pressure is rendered visible upon reaction of the chromogenic material with the developer particles 33 adhering to the medium 13, and at the same time, the visualized image is transferred onto the copying sheet medium 41 under pressure. The copying sheet medium 41 onto which the visible image is formed is finally discharged from the apparatus through the discharge port 43.

Figure 2:
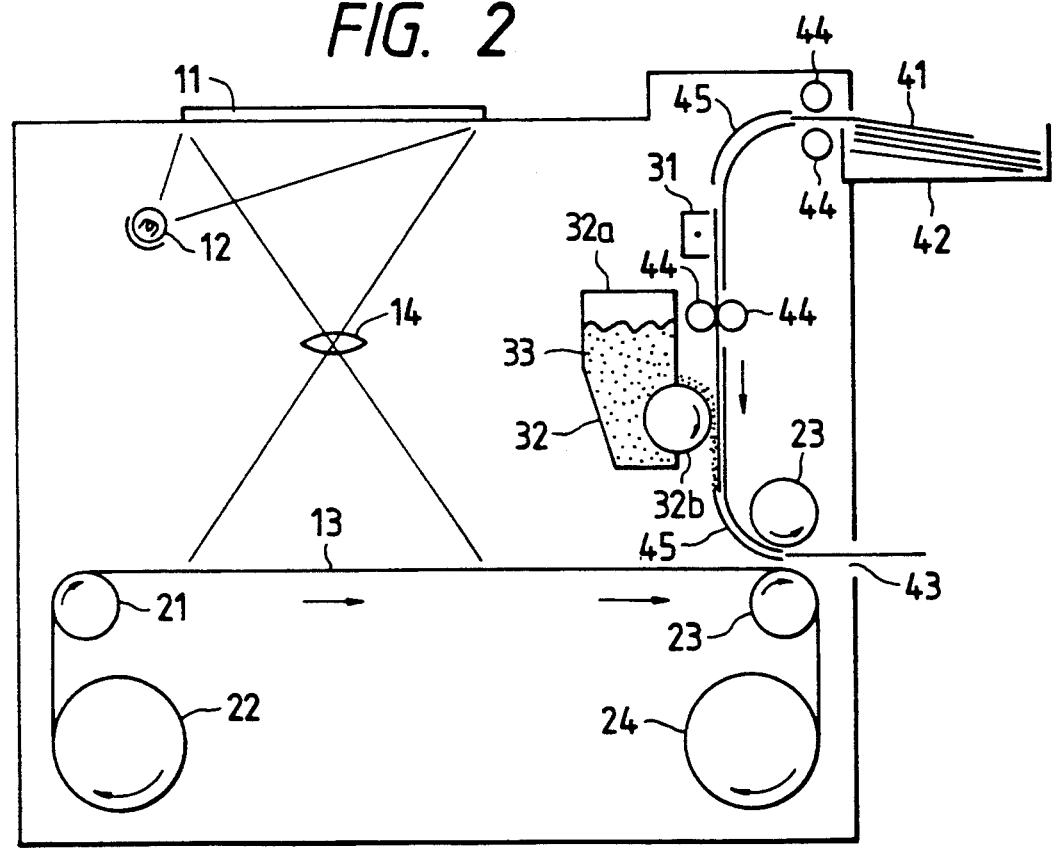
FIG. 2 is a schematic view showing an image recording apparatus according to a second embodiment of this invention; and, FIG. 3 is a schematic view showing an image recording apparatus according to a third embodiment of his invention.

A second embodiment according to this invention is shown in FIG. 2 wherein like parts and components are designated by the same reference numerals and characters as those shown in FIG. 1. In the first embodiment, the developer particles are uniformly dispersed on the photosensitive image recording medium. On the other hand, in the second embodiment, the developer particles are disposed on a copying sheet medium 41.

More specifically, according to the second embodiment, a charger 31 and a developer supplying unit 32 are provided along a copying sheet transfer system which conveys a copying sheet medium 41. Therefore, the developer toner 33 is caused to adhere electrostatically to the surface of the copying sheet medium 41 and the copying sheet medium 41 to which the developer toner 33 has been caused to adhere is laid on a latent imaging surface of the photosensitive recording medium 13 which latent image has been formed by the exposure system. The recording medium 13 and the copying sheet medium 41 are fed together to the pressure developing unit 23, where a visible image is formed on the copying sheet medium 41.

Figure 3:
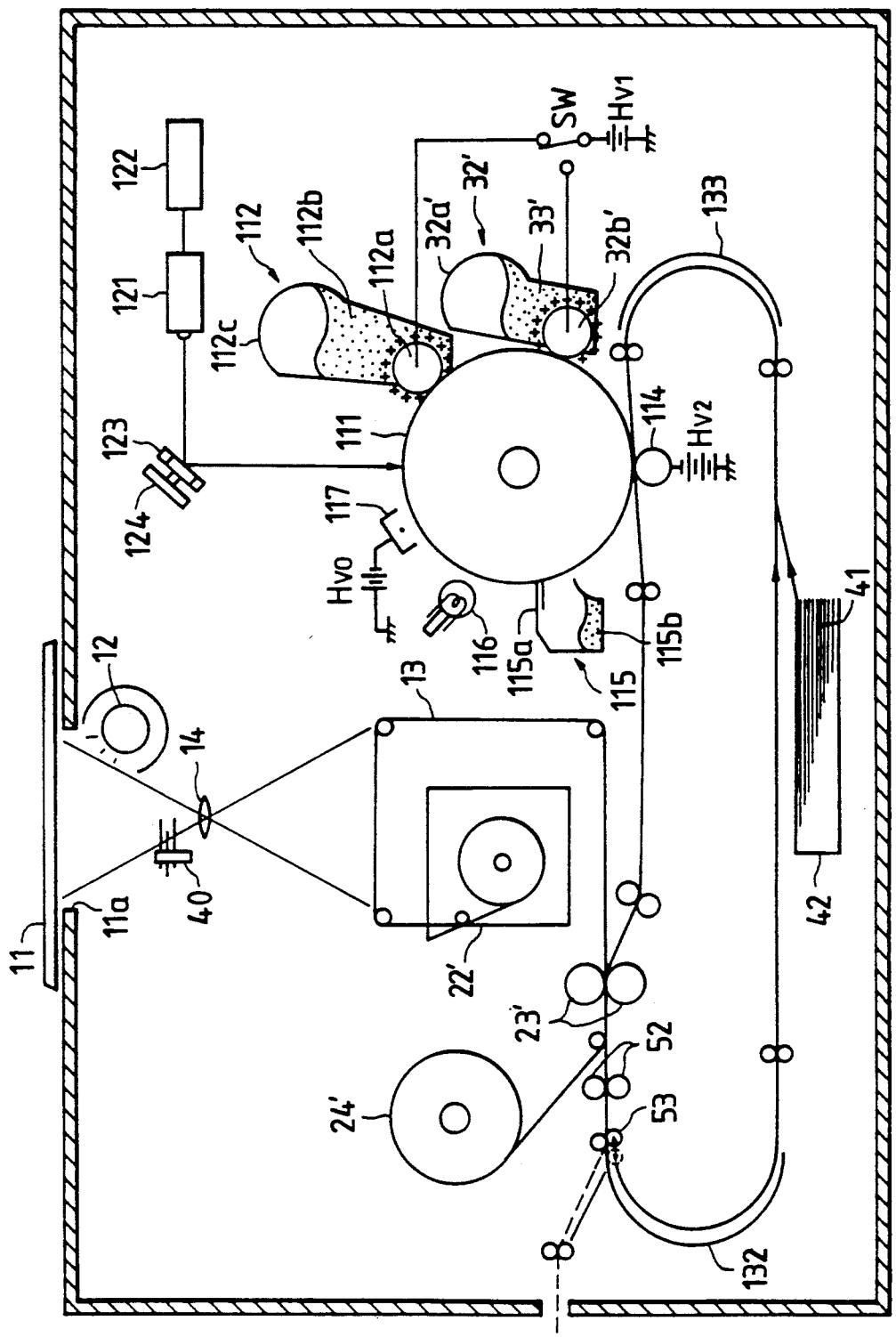

An image recording apparatus according to a third embodiment will next be described with reference to FIG. 3. The third embodiment relates to a modification to the second embodiment for forming a combined image including a picture image and a character image on a copying sheet medium. More specifically, in the third embodiment, developer particles 33' are transferred from a photosensitive drum 111 and are supplied over a copying sheet medium 41 for forming a visible picture image, and further, a toner particle 112b is again supplied to the copying sheet 41 by way of the photosensitive drum 11 for forming a visible character image on the identical copying sheet 41.

An image recording apparatus according to this embodiment is provided with the photosensitive pressure-sensitive recording portion. In this recording portion, light is applied from a light source 12 to an original 11 and is transmitted through a filter unit 40 and an imaging lens 14 to form a latent image corresponding to an image of the original on a photosensitive pressure-sensitive recording medium 13 supplied from a cartridge 22'. Driving means (not shown) is provided between the original 11 and the photosensitive pressure sensitive recording medium 13 for moving the original 11 relative to an exposure slit 11a.

The filter unit 40 is provided for color correction, since spectral radiation amount from the light source 12 must be controlled by the filter unit 40 in view of the photosensitivity of the photosensitive pressure sensitive recording medium 13. The filter unit 40 includes red, green and blue filters. The imaging lens 14 has variable imaging magnification. In response to the change in the imaging magnification of the lens 14, the exposure light scanning speed relative to the original 11 is altered, to thereby change a size of the latent image on the photosensitive pressure sensitive recording medium 13.

Below the cartridge 22', there is provided pressure developing rollers 23' and thermal fixing rollers 52. The photosensitive pressure-sensitive recording medium 13 and the copying sheet medium 41 are placed in intimate contact with each other and are pressed together for development purpose by these rollers. The developing rollers 23' includes a pair of rollers as shown. These rollers 23' and 23' are pressed together for developing the developer material. On the other hand, this roller nipping state is released when the medium 41 carrying also the black toner image (character image) is travelled through the rollers 23'. A takeup roller 24' is provided for winding the photosensitive pressure-sensitive recording medium 13.

A cassette 42 for storing a copying sheet medium 41 is disposed at a lowermost position of the apparatus. Further, a first guide 133 is provided for introducing the copying sheet medium 41 to an outer peripheral surface of a photosensitive drum 111 (described later). Furthermore, a changeover floating roller 53 is provided for discharging the medium 41 on which recording has been made, or for returning &the medium 41 to its original position above the cassette 42) so that a picture or character image may be formed again thereon. For this, a guide 132 is provided for again introducing the medium 41 to the photosensitive drum 111.

The image recording apparatus also includes an eleotrophotographic portion. In this portion, a laser light control circuit 122 is provided which transmits an appropriate digital image exposure signal to a laser beam source 121. The control circuit 122 is connected to an image scanner (not shown), so that picture image (first image) information and character image (second image) information on the original 11 is sent to the circuit 122. The laser beam emitted by the laser beam source 121 is applied to a photosensitive drum 111. The laser beam whose scanning represents the picture image is applied onto the drum 111, and the laser beam whose scanning represents the character image is also applicable onto the drum 111 in the subsequent process. Further, a polygonal mirror 123 is provided for directing laser beam from the laser beam source 121 toward the photosensitive drum 111. The polygonal mirror 123 is connected to a scanner motor 124.

The photosensitive drum 111 is surrounded by various units such as a black toner developing unit 112, a developer particle developing unit 32, a transfer roller 114 connected to a negative high voltage HV2, a cleaner 115, an electricity remover 116, and a charger 117. These are located one after another in clockwise direction about the drum 111 as viewed in FIG. 3.

The black toner developing unit 112 serves as toner applying means for forming a black toner character image in accordance with information on characters. This unit 112 includes a hopper 112c accumulating therein a black toner 112b and a developing sleeve 112a for feeding the black toner 112b onto the drum 111.

The developer developing unit 32' serves as developer applying means for developing a developer material electrostatically. The unit 32' includes a hopper 32'a, accumulating therein developer particulate materials 33' and a developing sleeve 32b' for feeding the developer material 33' onto the drum 111. Further, a change over switch SW is provided. The switch SW selectively connects one of the toner unit 112 and the developer material unit 32' to a power source HV1. Therefore, the black toner developing unit 112 and the developer developing unit 32' are not operable together at a time.

The transfer roller 114 is adapted for transferring the black toner character image on the photosensitive drum 111 onto the copying sheet 41. The cleaner 115 is adapted for recovering both the black toner 112b and the developer particles 33'. The cleaner 115 includes a cleaning blade 115a which recovers the residual toners 115b from the peripheral surface of the drum 111. The charger 117 is connected to a high-voltage power source H$_{VO}$.

Referring to the operation of the apparatus as hereinabove described, the light which has been applied to the original Il by the light source 12 is transmitted through the filter unit 40 and the imaging lens 14 to form the latent image on the photosensitive pressure-sensitive recording medium 13. The medium 13 carries microcapsules and they are selectively exposed to the light so that the light exposed microcapsules are photo-cured to form the latent image corresponding to the original 11 on the medium 13. For the exposure, the original 11 is moved by the driving means (not shown) in order to successively form the latent image on the photosensitive medium 13. Thus, the latent image corresponding to the original is formed on the photosensitive pressure sensitive recording medium 13.

As the photosensitive drum 111 is rotated, the residual electric charge remaining thereon is removed by the electricity remover 116 and the circumferential surface of the drum 111 is uniformly charged with electricity by the charger 117. Information on a picture is read by, for example, the image scanner (not shown). The laser beam source 121 emits laser beam to the polygonal mirror 123 driven by the scanner motor 124. The laser beam is responsive to one of the picture and character signals sent from the laser light control circuit 122 and the beam is of single wavelength. The light from the polygonal mirror 123 is irradiated onto the photosensitive drum 11 for scanning exposure, since the polygonal 123 is rotated. As a result of this exposure, an electrostatic latent image is formed on the drum 111 by an electrostatic contrast between its unexposed portion and its exposed portion.

The black toner developing unit 12 causes the black toner 112b to adhere electrostatically to the drum 11 and thereby provide a black toner visible image on the drum 111. On the other hand, the developer developing unit 32' causes the developer material 33' to adhere electrostatically to the unexposed portion of the drum 111 and thereby provide developer material visible image on the drum 111. One of the visible images which has been formed on the drum 111 is transferred onto the copying sheet medium 41 by the transfer roller 114 to which the negative high voltage HV2 is applied. The cleaning blade 115a recovers the residual toner 115b from the circumferential surface of the drum 111.

As described above, the black toner developing unit 112 and the developer developing unit 32 are not operated together at a time for selectively forming picture image and toner image on the copying sheet medium 41.

The photosensitive drum 111 is first exposed to light containing the picture image information from the laser beam source 121, The picture image information concerns information to the photosensitive pressure-sensitive 1 recording medium 13. Therefore, electrostatic area is provided on the photosensitive drum 111 for forming the developer material particles 33' thereon. In this case, the changeover stitch SW is so positioned that no developing bias is applied to the black toner developing unit 112, but that a negative high potential HV1 is applied to the developer developing unit 32'. The sleeve 112a to which no developing bias is applied is grounded. If the drum 111 is rotated, its electrostatic area is coated with the developer material and no black toner adheres to it. The developer material with which the drum 111 has been coated is transferred by the transfer roller 114 to the copying sheet medium 41 which has reached it.

The medium 41 on which recording is to be made and the photosensitive pressure-sensitive recording medium 13 on which the latent image has been formed are placed in intimate contact with each other under pressure by the pressure developing means 23'. As a result, the uncured micro-capsules in the unexposed portion of the medium 1 are ruptured, and the dye precursor flowing out of the ruptured microcapsules undergoes a chromogenic reaction with the developer material adhering to the medium 41. In this case, since the developer material particles are only dispersed at an imaging region corresponding to the picture imaging region, a clear visible image can be provided even if the photosensitive medium 13 is subjected to erroneous light exposure due to, for example, light leakage.

After such development under pressure, the medium 13 is wound on the takeup roller 24' and the developer material which has developed a color on he medium 41 is fixed by the thermal fixing rollers 52.

When the floating roller 53 is in its discharging position, it allows the medium 41 on which the color has been developed to be discharged out of the apparatus. However, when the change over roller 53 is in its paper feeding position, it causes the medium 41 to move along the guide plate 132 and return to its original position. The medium 41 on which the color has been developed is eventually conveyed again to a position between the photosensitive drum 111 and the transfer roller 114.

When drum 111 is rotated for the second time an image (such as character image) is formed by the black toner 112b. Signals indicative of the character information are transmitted from the laser light control circuit 122 to provide a character image scanning beam from the laser beam source 121, so that an electrostatic latent image is provided on the drum 111. On the other hand, upon switching the switch SW, the negative high voltage HV1 is applied to the black toner developing unit 112. Therefore, upon rotation of the drum 111, the black toner 112b is dispersed over the latent image portion on the drum 111 for providing a visible toner image on the drum. The toner image on the drum 111 is then transferred onto the copying sheet medium 41 which have already carried the visible color picture image.

The medium 41 on which the developer material 33' and the black toner 112b have been transferred is conveyed to the thermal fixing rollers 52, whereby the black toner 112b is fixed. Incidentally, when the medium 41 travels between the pressure developing rollers 23', the copying sheet medium 41 is not pressed by the rollers 23', since the pressure developing rollers 23' have been spaced apart from each other appropriately.

The medium 41 on high the picture and character images have been formed is discharged out of the apparatus by the floating roller 53.

The present invention is not limited to the above described embodiments, but any of the following modifications can be made insofar as they do not depart from the spirit and scope of this invention:

(1) In the first and second embodiments, an electricity removing unit and a developer recovery unit may be provided along the system for conveying the photosensitive recording medium between the developer supplying unit 32 and the takeup drum 24;

(2) Instead of the toner consisting solely of a developer material, a developing toner in the form of fine particles which are prepared by mixing a developer material and a thermoplastic resin and pulverizing their mixture may be used;

(3) In the first and second embodiments, similar to the third embodiment, a thermal fixing unit may be employed for heating the copy recording medium to fix the transferred image, whereby it is possible to obtain a glossy image;

(4) The charger 31 may be positioned between the supply drum 22 from which the photosensitive recording medium is unwound and an image fooussing position on the photosensitive recording medium 13;

(5) A digital exposure system which employs, for example, a laser, shutter, CRT, LED or plasmatic means for emitting light may be used instead of the analog exposure system.

(6) In the third embodiment, the image recording apparatus can also be used for performing only the photosensitive pressure-sensitive image recording method which exclusively uses the developer material particles 33', or electro-photographic recording method which exclusively uses the toner 112b. Further, it is possible to use a colored toner instead of the black toner 112b which has been described as being used in the eleotrophotographic portion of the apparatus.

In view of the foregoing, this invention makes it possible to form an image easily on any kind of copying sheet medium by employing a photosensitive recording medium and the developer particles. Therefore, The invention is available for a wide range of application, as it enables the recording an image on, for example, a sheet of report paper or postcard on hand.

Further, the invention makes it possible to coat any desired position with the developer material, as it is applied by the developer developing unit. In the third embodiment, the developer material is provided at a specific portion of the copying sheet in accordance with information on the image in the original. Therefore, no output image is formed in any region not coated with the developer material, even if any non-image area of the photosensitive recording medium may be exposed to leaking light. Accordingly, it is advantageously possible to obtain a high contrast between the image and non-image areas, and a clear reproduction of character image is attainable.

While the invention has been described in detail and with reference to specific embodiments thereof, it would be apparent for those skilled in the art that various changes and modifications can be made therein without departing from the spirit and scope of the invention.

What is claimed is:

1. An image recording apparatus for recording an output image on a sheet medium, the sheet medium being any ordinary copying sheet material, the output image corresponding to an image of an original, said original containing first and second images, the apparatus using a photosensitive recording medium having a surface which carries microcapsules encapsulating therein a chromogenic material, the apparatus comprising:

exposure unit means for exposing to light said photosensitive recording medium for forming a latent image corresponding to said first image on the photosensitive recording medium;

supplying means for supplying developer material particles which undergo a chromogenic reaction with the chromogenic material, the supplying means supplying said developer material particles to the ordinary copying sheet material for recording said first image, said developer material particles supplying means including a photosensitive drum;

pressure developing unit means disposed downstream of the exposure unit for generating the chromogenic reaction between the chromogenic material and said developer material particles to provide said first image on the ordinary copying sheet material; and means for supplying toner particles onto said ordinary copying sheet for recording said second image thereon, said toner particles supplying means comprising:

a photosensitive drum;

a toner image forming means for forming a toner image corresponding to the second image onto the photosensitive drum; and a means for transferring the toner image on the photosensitive drum onto said ordinary copying sheet.

2. The image recording apparatus as defined in claim 1, wherein the first image is a picture image and the second image is a character image.

3. The image recording apparatus as defined in claim 1 further comprising means for forming a developer material particle image corresponding to first image, said toner image forming means being operated during an inoperative state of the developer material particle image forming means.

4. The image recording apparatus as defined in claim 3 further comprising a thermal fixing unit disposed downstream of the pressure developing unit for fixing the output image on the ordinary copying sheet.

* * * * *